United States Patent
Zhang et al.

(10) Patent No.: US 8,587,356 B2
(45) Date of Patent: Nov. 19, 2013

(54) RECOVERABLE AND RECONFIGURABLE PIPELINE STRUCTURE FOR STATE-RETENTION POWER GATING

(75) Inventors: Shayan Zhang, Tianjin (CN); William C. Moyer, Dripping Springs, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/403,597

(22) Filed: Feb. 23, 2012

(65) Prior Publication Data

US 2013/0154707 A1 Jun. 20, 2013

Related U.S. Application Data

(63) Continuation-in-part of application No. 13/326,685, filed on Dec. 15, 2011.

(51) Int. Cl.
   *H03K 3/00* (2006.01)
(52) U.S. Cl.
   USPC ........................................ 327/218
(58) Field of Classification Search
   USPC ......... 327/199–203, 208, 210–212, 214, 215, 327/218
   See application file for complete search history.

(56) References Cited

U.S. PATENT DOCUMENTS

| | | | |
|---|---|---|---|
| 5,889,788 A | 3/1999 | Pressly et al. | |
| 5,920,575 A | 7/1999 | Gregor et al. | |
| 7,155,618 B2 | 12/2006 | Moyer et al. | |
| 7,362,134 B2 | 4/2008 | Bajkowski et al. | |
| 7,453,756 B2 | 11/2008 | Moyer et al. | |
| 7,548,102 B2 | 6/2009 | Ramaraju et al. | |
| 7,548,103 B2 | 6/2009 | Ramaraju et al. | |
| 7,710,177 B2 * | 5/2010 | Hoover | 327/218 |
| 7,800,974 B2 | 9/2010 | Zhang et al. | |
| 7,843,218 B1 | 11/2010 | Ramaraju et al. | |
| 2002/0075058 A1 * | 6/2002 | Hwang et al. | 327/407 |
| 2003/0226000 A1 | 12/2003 | Rhoades | |
| 2006/0192596 A1 | 8/2006 | Ramaraju et al. | |
| 2006/0192604 A1 | 8/2006 | Ramaraju et al. | |
| 2007/0222480 A1 | 9/2007 | Bajkowski et al. | |

(Continued)

OTHER PUBLICATIONS

Farzan Fallah, et al., "Standby and Active Leakage Current Control and Minimization in CMOS VLSI Circuits", IEICE Transactions on Electronics (2005), vol. E88-C, Issue: 4, pp. 509-519, ISSN: 0916-8524.

(Continued)

*Primary Examiner* — Lincoln Donovan
*Assistant Examiner* — Sibin Chen

(57) ABSTRACT

A system, electronic circuit, and method are disclosed. A method embodiment comprises receiving a control signal associated with a power gating operation mode of an electronic circuit, applying a reference voltage to the electronic circuit based upon the power gating operation mode, and maintaining data representing a state of a logic stage of the electronic circuit based upon the power gating operation mode. Maintaining comprises, in the described embodiment, storing data of a state of a first logic stage of the electronic circuit within a first storage element in a first power gating operation mode, and recovering data of a state of a second logic stage of the electronic circuit utilizing the data of the state of the first logic stage of the electronic circuit within the first storage element in a second power gating operation mode.

19 Claims, 14 Drawing Sheets

(56) References Cited

U.S. PATENT DOCUMENTS

2008/0086626 A1* 4/2008 Jones et al. ............... 712/225
2008/0250271 A1* 10/2008 Ozer et al. ................ 714/15
2009/0213668 A1 8/2009 Zhang et al.
2009/0256608 A1 10/2009 Djaja et al.

OTHER PUBLICATIONS

Eric L. Hill, et al., "Transparent mode flip-flops for collapsible pipelines", International Conference on Computer Design 2007: 25th International Conference on Computer Design, Oct. 7-10, 2007, pp. 553-560, ISSN: 1063-6404.

Hans Jacobson, et al., "Stretching the Limits of Clock-Gating Efficiency in Server-Class Processors", Proceedings of the 11th Int'l Symposium on High-Performance Computer Architecture (HPCA-11 2005), Feb. 12-16, 2005, pp. 238-242, ISSN: 1530-0897.

Hailong Jiao, et al., "Low-Leakage and Compact Registers with Easy-Sleep Mode", Journal of Low Power Electronics, (2010), vol. 6, pp. 1-17, 2010, ISSN: 1546-1998.

Hamid Mahmoodi-Meimand, et al., "Data-Retention Flip-Flops for Power-Down Applications", Proceedings of the 2004 International Symposium on Circuits and Systems, 2004. ISCAS '04, May 23-26, 2004, pp. II-677-80 vol. 2, ISBN: 0/7803-8251-X.

Freescale Semiconductor Inc., "Freescale Technologies for Energy Efficiency", Whitepaper, (2007), pp. 1-9, Document Number: ENERGYEFFWP REV 1.

Non-Final Office Action mailed Jan. 7, 2013 for U.S. Appl. No. 13/326,685, 11 pages.

U.S. Appl. No. 13/326,685, filed Dec. 15, 2011, entitled "Configurable Flip-Flop".

Final Office Action mailed May 15, 2013 for U.S. Appl. No. 13/326,685, 15 pages.

* cited by examiner

ND RECONFIGURABLE
RECOVERABLE AND RECONFIGURABLE PIPELINE STRUCTURE FOR STATE-RETENTION POWER GATING

CROSS-REFERENCE TO RELATED APPLICATIONS

This application is a continuation-in-part of U.S. patent application Ser. No. 13/326,685, entitled, "Configurable Flip-Flop" and naming Shayan Zhang and Ravindraraj Ramaraju as inventors. Applicants hereby claim the benefit of priority to the identified prior application(s), the disclosure of which is incorporated into the present application in its entirety and for all purposes.

BACKGROUND

This disclosure relates generally to the design, implementation and utilization of electronic circuits, and more specifically, to a recoverable and reconfigurable pipeline structure for use in electronic circuits.

Electronic circuits (e.g., integrated circuits (ICs), microprocessors, microcontrollers, digital signal processors, digital signal controllers, sensors, RF power ICs, power management ICs, system on a chip (SoC) devices, and the like) have become ubiquitous in recent years. While the number of electronic circuits has steadily increased, there has been a concomitant decrease in the average size of such electronic circuits and the discrete devices used in their construction. So-called 'transistor scaling' has increased transistor density resulting in decreased device size and active logic power consumption in modern integrated circuits of all types.

Adherence to Moore's law in modern integrated circuit fabrication does however create a number of negative consequences or limitations. Increasing transistor density similarly increases the likelihood of fabrication errors or electromagnetic compatibility issues (e.g., capacitive or inductive coupling) while decreasing area available for scan, built in self-test (BIST), and other testing and verification components and vastly increases the place and route complexity of electronic circuits. Another significant issue, particularly with regard to modern battery-powered electronic devices, is leakage-current and associated power dissipation of inactive logic within electronic circuits. Leakage current can include reverse-biased junction leakage current, gate-induced drain leakage, gate direct-tunneling leakage and subthreshold or "weak inversion" leakage.

In conventional electronic circuits, a number of techniques have been adopted to address some of the described issues stemming from transistor scaling. The majority of these techniques rely on either a reduction (scaling) or a removal (gating) of signals such as clock signals and power supply rail voltages that are applied to functional elements or portions thereof of electronic circuits. While such techniques reduce power consumption of inactive elements, they typically require that the state of the associated electronic circuit be saved either locally in specialized state-retention storage elements whose storage capabilities are not impacted by scaling or gating or remotely (e.g., in system memory or backing store). Remote storage of system state requires that storage resource contention and remote storage latency be addressed and is therefore undesirable. Local, state-retention storage element state storage is typically simpler and faster to implement but consumes more die area, increases leakage power dissipation, negatively impacts electronic circuit performance, and increases design complexity in order to routing the separate power supply rails typically required by such storage elements, counteracting many of the benefits derived from techniques such as power gating.

FIG. 1 illustrates an electronic circuit including a number of logic stages interleaved with state-retention flip flops to facilitate power gating according to the prior art. More specifically, the electronic circuit 100 of FIG. 1 includes a number, "n" of logic stages 102-106, where each logic stage is separated from adjacent logic stages via state-retention flip flops 108a-108n as shown. Each state-retention flip flop 108 includes inputs for data (labeled "D"), normal operation mode and a low-power operation mode power supply rail voltages or "supply voltages" (Vdd and Vddc, where Vddc is a voltage lower than Vdd and Vddc is constantly applied to each of state-retention flip flops 108), a clock signal and a state-retention enable control signal as well as a data output (labeled "Q"). Electronic circuit 100 of FIG. 1 further includes a memory 112 for storage of an evaluation result of electronic circuit 100 or remote storage for system state of electronic circuit 100 as previously described.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A logic pipeline is configured in a first operation mode where all of its sequential storage elements contain a first set of states of the pipeline operating in an initial state of Power Gating (PG). The logic pipeline is reconfigurable in real-time to a second operation mode where only a portion of the sequential storage elements coupled to a set of starting points and ending points along the logic pipeline contain valid set of states, whereas the remaining sequential storage elements do not retain valid sets of states upon entering a second state of power gating (PG). According to one embodiment, the described logic pipeline can be configured in real-time to a third operation mode where the remaining sequential storage elements recover the first set of states from the portion of sequential storage elements at starting and ending points along the logic pipeline, upon entering a third state of PG.

Figure 1:
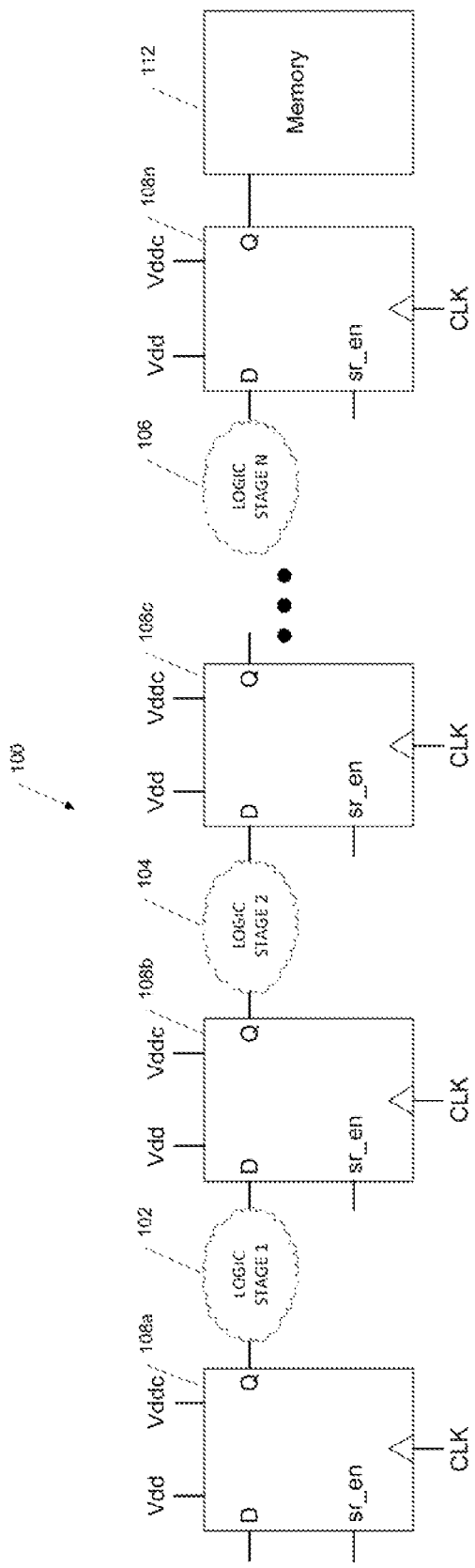
FIG. 1 illustrates an electronic circuit including a number of logic stages interleaved with state-retention flip flops to facilitate power gating according to the prior art.
Figure 2:
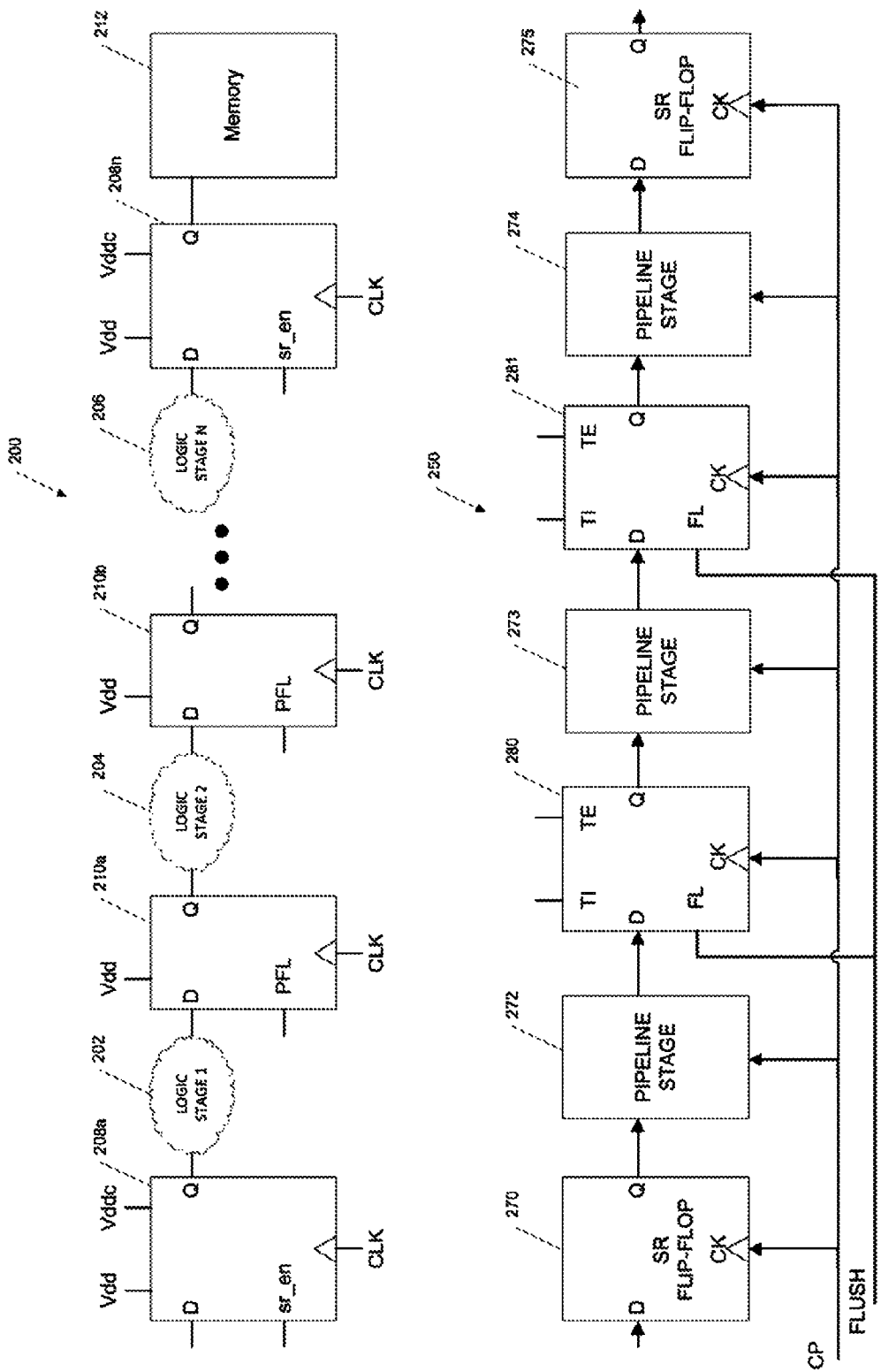
FIG. 2 illustrates an electronic circuit according to a first embodiment of the inventive subject matter.

FIG. 2 illustrates an electronic circuit according to a first embodiment of the inventive subject matter. Such an electronic circuit may comprise, in various embodiments, a circuit, logic component, or any subcomponent thereof. In several embodiments of the present invention, an electronic circuit as described herein comprises a portion of a Kinetis™ microcontroller or QorIQ® processor, both provided by Freescale Semiconductor, Inc. of Austin, Tex. Electronic circuit 200 of the depicted embodiment includes state-retention storage elements 208 (e.g., state-retention flip flop 108 as described with respect to FIG. 1) coupled to a logic array which includes a number of logic stages 202 and a number of additional storage elements 210 as shown. In the example embodiment of FIG. 2, a memory 212 is also included as part of electronic circuit 200. In various alternative embodiments, such a memory may be excluded or may be provided separately from electronic circuit 200. In operation, electronic circuit 200 may operate in any of a plurality of power gating modes as will now be describe in greater detail in conjunction with a description of FIG. 3 which illustrates a timing diagram representation of one or more signals associated with the electronic circuit of FIG. 2.

Figure 3:
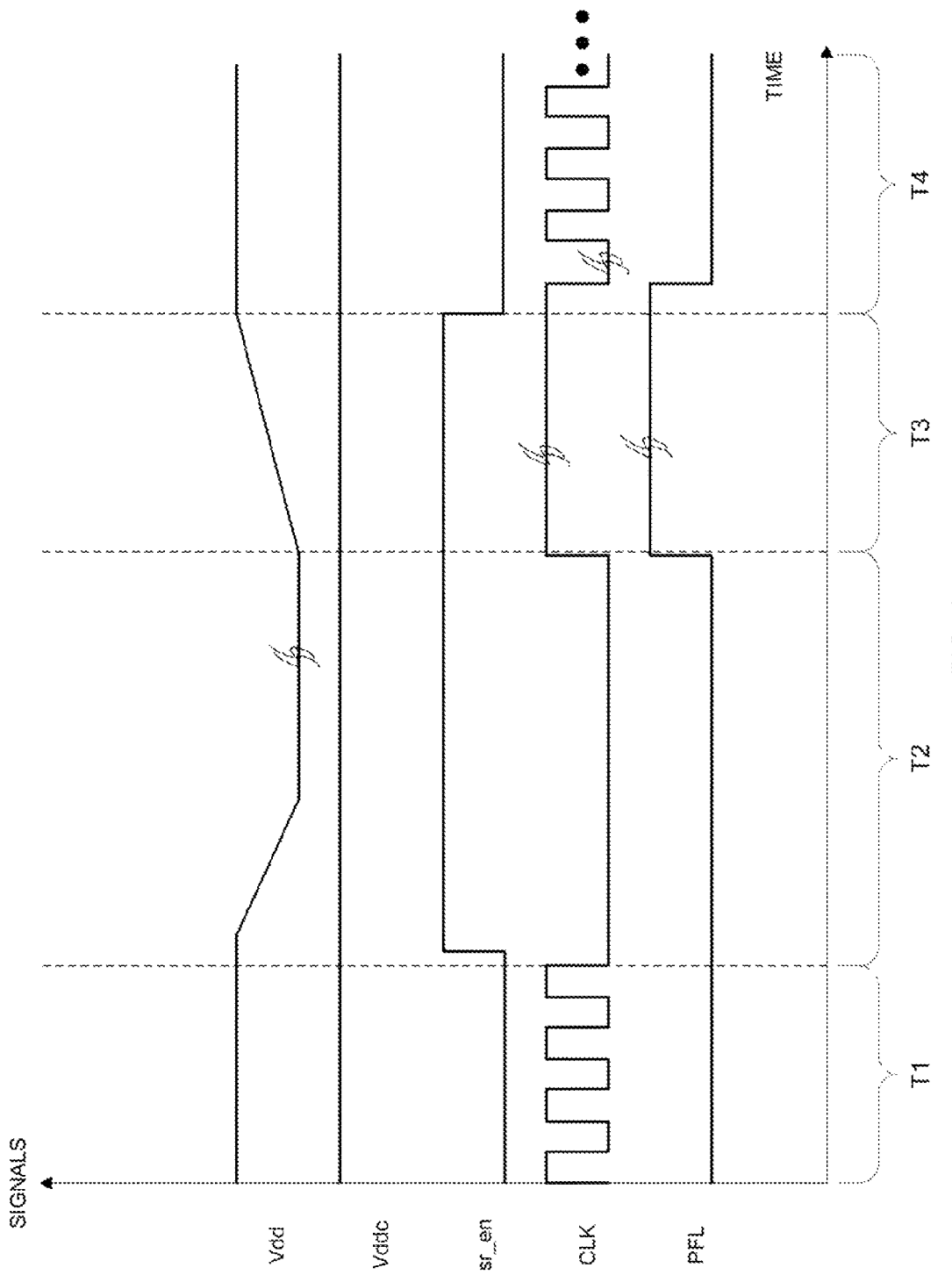
FIG. 3 illustrates a timing diagram representation of one or more signals associated with the electronic circuit of FIG. 2.

In a first power gating operational mode, represented within the context of FIG. 3 as time period T1, a rail voltage (Vdd) as well as a secondary, lower rail voltage Vddc and a clock signal are applied to each of state-retention storage elements 208 and storage elements 210 and the state of electronic circuit 200 (i.e., the output of each of logic stages 202-206) is retained in state-retention storage elements 208 and storage elements 210. During such a power gating operational mode, electronic circuits and their associated devices operate at full power in a normal operational or execution mode. In one or more example embodiments, logic stages 202-206 may represent a datapath or instruction execution pipeline of, for example, a microcontroller or SoC. During time period T1, a state-retention enable control signal (sr_en) is provided such that state-retention storage elements 208 are configured to retain state utilizing rail voltage Vdd rather than Vddc as associated with a low-power or "sleep" power gating operational mode which will be discussed further herein. As depicted in the embodiment of FIG. 3, the sr_en control signal is held at a logical "low" value during this time period. Similarly, a pipeline flow-through control (PFL) control signal is maintained (at a logical "low" value) such that storage elements 210 retain (e.g., latch or store) the outputs of their adjacent logic stages rather than operating transparently to merely pass or "flow-through" such outputs to the next adjacent pipeline or logic stage.

FIG. 2 further illustrates a block diagram of a pipeline 250 of an electronic device in accordance with an alternative embodiment of the present disclosure. In the depicted embodiment, pipeline 250 is an instruction pipeline of a data processor. Pipeline 250 includes state retention flip-flops 270 and 275, pipeline stages 272, 273, and 274, and flushable flip-flops 280 and 281. "Flow-through" flushable flip-flops 280 and 281 are each configured similarly to storage elements 210.

State retention flip-flop 270 includes an input to receive data, an output, and a clock input to receive the clock signal CP. Pipeline stage 272 includes a connection to an output of state retention flip-flop 270, a connection to receive clock signal CP, and an output. A D input of flushable flip-flop 280 is connected to an output of pipeline stage 272, a FL input is connected to receive the flush control signal FLUSH, and a CK input is connected to receive the clock signal CP. Pipeline stage 273 includes a connection to a Q output of flushable flip-flop 280, a connection to receive the clock signal CP, and an output. A D input of flushable flip-flop 281 is connected to an output of pipeline stage 273, a FL input is connected to receive the flush control signal FLUSH, and a CK input is connected to receive the clock signal CP. Pipeline stage 274 includes a connection to a Q output of flushable flip-flop 281, a connection to receive the clock signal CP, and an output. State retention flip-flop 275 includes a data input connected to an output of pipeline stage 274, a data output, and a clock input to receive the clock signal CP.

State-retention flip-flops 270 and 275 are each configured to latch data at their inputs based on edges of the clock signal CP. In addition, state-retention flip-flops 270 and 275 are each configured to retain their latched data when pipeline 250 is placed in a low-power mode.

Pipeline stages 272-274 are each configured to perform different operations to allow pipeline 250 to execute its designated functions. For example, in an embodiment each of pipeline stages 272-274 performs different operations for an instruction pipeline. Thus, pipeline stage 272 can be configured to dispatch instructions while pipeline stage 273 is configured to execute dispatched instructions. During operation, pipeline stages 272-274 receive data from and provide data to the flip-flops connected to the corresponding stage. Thus, for example, pipeline stage 272 can receive input data from state-retention flip-flop 270 and provide output data to flushable flip-flop 280.

The flush control signal FLUSH can be used to control whether flushable flip-flops 280 and 281 are placed in the normal mode or the buffer mode. In one embodiment, flushable flip-flops 280 and 281 are placed in the normal mode when pipeline 250 is in a normal, active power mode and are placed in the buffering mode when pipeline 250 is undergoing a power gating sequence to allow pipeline 250 to exit the low-power mode efficiently. In particular, when pipeline 250 is undergoing the power gating sequence, the clock signal CP can enter an indeterminate state. By placing flip-flops 280 and 281 into the buffering mode as pipeline 250 exits the low-power mode, any data retained in pipeline 250 prior to the low-power mode can be flushed.

In addition, flushable flip-flops 280 and 281 can be placed in the buffering mode during testing of pipeline 250, thereby simplifying the test process. For example, by placing flushable flip-flops 280 and 281 in the buffering mode, the scan chain for testing of the pipeline can be reduced, thereby reducing the complexity of the test process.

In an embodiment, flushable flip-flops 280 and 281 can be configured such that each of the flip-flops includes a master stage and slave stage that can individually be placed in the normal or buffering modes. Accordingly, during testing of pipeline 250, flip-flop 280 can be configured so that its master stage is placed in the normal mode and its slave stage is placed in the buffering mode. Flip-flop 280 is thus effectively configured as a transparent L1 latch (a latch that is controlled by rising edges of the clock signal CP). Further, flip-flop 281 can be configured so that its master stage is placed in the buffering mode and its slave stage is placed in the normal mode. Flip-flop 281 is thus effectively configured as a transparent L2 latch (a latch that is controlled by the falling edge of the clock signal CP). This configuration can allow for the timing and operation of the stages of pipeline 250 to be tested in different ways, thus providing for testing flexibility.

In another embodiment, independent flush control signals can be provided to each of the flushable flip-flops in the pipeline, so that each flip-flop can be independently placed in the normal mode or the buffer mode. The state of each flush control signal can be set based on a value stored at a reprogrammable register, so that the mode of each flushable flip-flop can be reprogrammed by a user. In still another embodiment, the flush control signals can independently set the operating modes for each master and slave stage of the flushable-flip flops. Thus, the user can independently set the operating mode for each stage of each flushable flip-flop by storing a value at the reprogrammable register.

During a next power gating operational mode, represented within the context of FIG. 3 as time period T2, although Vddc is continuously applied to state-retention storage elements 208, rail voltage Vdd is withdrawn from all of the elements of electronic circuit 200, an applied clock signal may also be withdrawn, held at a logical "low" level or vary/be undetermined. Within this power gating operational mode, an associated electronic circuit is being "powered down" to enter, during or at the conclusion of the mode, a "low power" operational state. During time period T2, the sr_en control signal is asserted/held at a logical "high" level so that state information may be retained by state-retention storage elements 208 using the lower power Vddc rail voltage.

Entering a new power gating operational mode, represented within the context of FIG. 3 as time period T3, the sr_en control signal, clock signal, and PFL control signal are all held at a logical "high" level in order to flush erroneous logic stage output and protect memory (e.g., memory 212) as the previously retained electronic circuit state is propagated from an associated state-retention storage element 208 through all prior logic stages as the Vdd rail voltage is reapplied as shown. The associated power gating operational mode entails a "recovery" or return to a normal operational mode for associated electronic circuits and devices subsequently, during a time period represented as T4, when electronic circuit 200 returns to its normal operational mode. The Vdd rail voltage is applied to all functional elements of electronic circuit 200, the sr_en control signal is de-asserted as is the PFL controls signal once all of storage elements 210 have been flushed and the clock signal is re-applied to the circuit as normal operations and logic evaluation is resumed.

Figure 4:
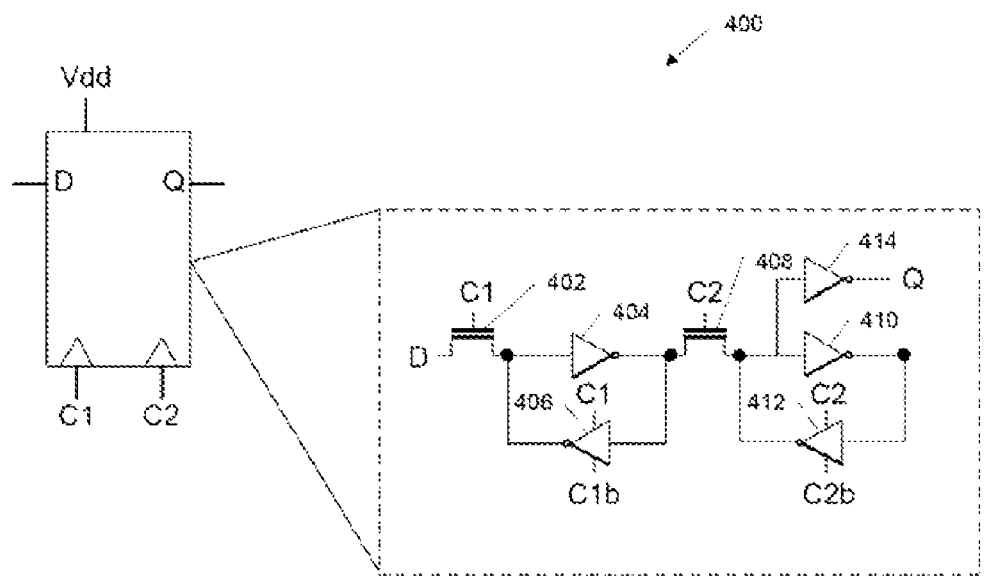
FIG. 4 illustrates a two-clock-signal-based flow-through storage element useable with one or more embodiments of the inventive subject matter.

FIG. 4 illustrates a two-clock-signal-based flow-through storage element useable with one or more embodiments of the inventive subject matter. More specifically, in the embodiment of FIG. 4, one or more of storage elements 210 of FIG. 2 is implemented using a level-sensitive scan design (LSSD) "master-slave" design for test or "scan" flip flop (MSFF). Such LSSD MSFF elements are frequently provided as part of a standard logic or "cell" library for use in application specific integrated circuit (ASIC) and field-programmable gate array (FPGA) design. Since the use of storage elements 210 within electronic circuit 200 is prevalent, the use of an existing "IP-core" library element, avoids changes to existing, established tooling. Use of a two-clock signal based flow-through storage element eliminates the need to provide separate explicit logic to generate a PFL control signal.

The flow-through storage element design depicted in FIG. 4 requires the application of two separate clock signals, C1 and C2 as shown and that each of the supplied clocks is buffered. As depicted in FIG. 4, MSFF 400 operates in a conventional manner to retain supplied state information in one power gating operation mode and may be reconfigured to act as a flow-through buffer for a data input "D" by removing a feedback path inverter from each of the component latches of the device via the application of clock signals C1 and C2 and their buffered counterpart clock signals C1b and C2b respectively as shown. The illustrated MSFF 400 includes an N-channel type insulated gate field effect transistor (IGFET) such as an N-type Metal-Oxide-Semiconductor Field Effect Transistor (MOSFET) or "NMOS" 402 coupled to the data input signal "D" with clock signal C1 applied to the device's gate. The output of NMOS 402 is in turn coupled to a latch composed of inverters 404 and 406 arranged in a feedback path as shown. In operation as a flow-through buffer, a clock signal C1 and a buffer-delayed copy C1b are applied to feedback inverter 406 to render the feedback path open and to reduce dynamic power dissipation. MSFF 400 further includes an additional N-channel type IGFET, NMOS 408 which passes the output of the previously-described first latch to a second latch composed of inverters 410 and 412 arranged in a similar feedback path as well as to an output of MSFF 400 via an inverter 414.

Figure 5:
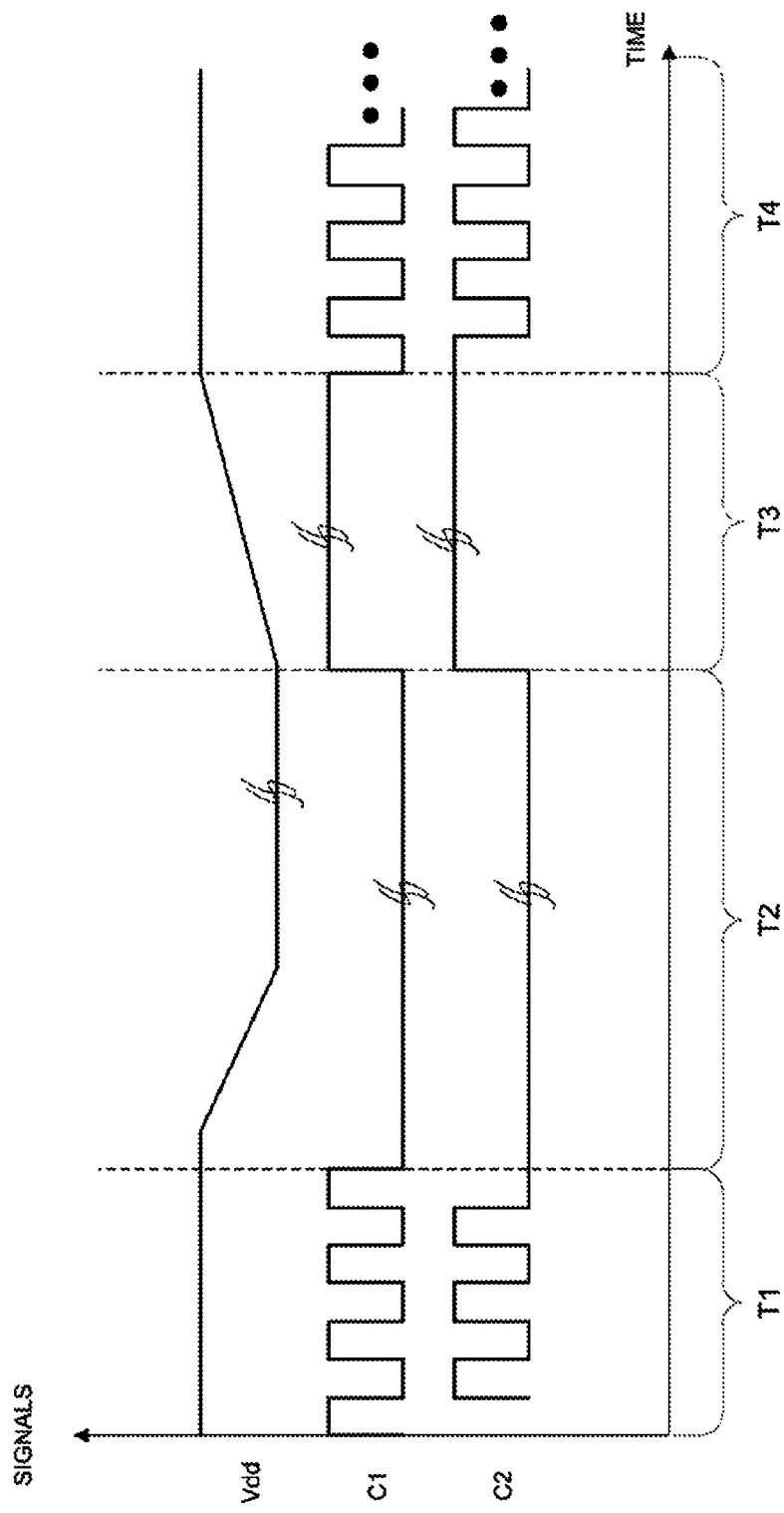
FIG. 5 illustrates a timing diagram representation of one or more signals associated with the storage element of FIG. 4.

FIG. 5 illustrates a timing diagram representation of one or more signals associated with the storage element of FIG. 4. In a first power gating operational mode, represented within the context of FIG. 5 as time period T1, during which a rail voltage (Vdd) as well as a secondary, lower rail voltage Vddc and a clock signal are applied to each of state-retention storage elements and storage elements as previously-described, clock signals C1 and C2 are active at a predetermined frequency. In a second power gating operational mode, represented within the context of FIG. 5 as time period T2, the Vdd rail voltage is withdrawn from the associated electronic circuit and clocks C1 and C2 may be low or undetermined. In a third power gating operational mode, represented within the context of FIG. 5 as time period T3, MSFF 400 is flushed by holding both C1 and C2 clock signals at a logical "high" value such that the feedback/latch paths created by inverters 406 and 412 are both cut off such that any applied input data signal is passed through NMOS transistors 402 and 408 and inverters 404 and 414 to the output of MSFF 400. In a fourth power gating operational mode, represented within the context of FIG. 5 as time period T4, MSFF 400 and associated clock signals C1 and C2 returns to normal operation/processing.

Figure 6:
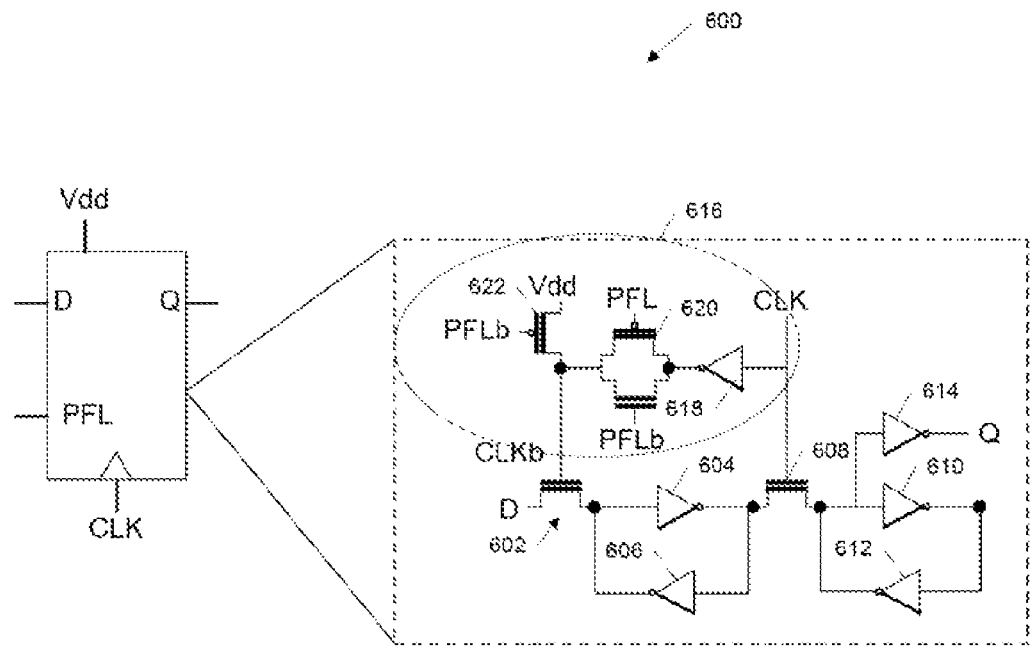
FIG. 6 illustrates a single-clock-signal-based flow-through storage element useable with one or more embodiments of the inventive subject matter.

FIG. 6 illustrates a single-clock-signal-based flow-through storage element useable with one or more embodiments of the inventive subject matter. As previously described with respect to FIG. 4, MSFF 600 of FIG. 6 includes NMOS transistors 602 (coupled to a data input signal "D") and 608 and master and slave latches including inverters 604 and 606 and 610 and 612, respectively and an output coupled to an inverter 614 from a "slave" latch as shown. MSFF 600 however utilizes a "mux/multiplexer-D" design for test/scan-based design approach however which is not level-sensitive but rather utilizes a separate multiplexer (not shown) to select between a primary data input signal and a secondary data input signal (e.g., a test or scan chain input). MSFF 600 therefore further includes clock signal control circuitry 616 which in turn includes an inverter 618 coupled to an input clock signal, a transmission gate 620, and a P-channel type insulated gate field effect transistor (IGFET) such as an P-type Metal-Oxide-Semiconductor Field Effect Transistor (MOSFET) or "PMOS" 622. An embodiment of the present inventive subject matter utilizing MSFF 600 or one having similar characteristics reduces the number of transistors required for implementation as well as setup and hold time, clock loading, and logic (D→Q) delay. Moreover, in alternative embodiments, MSFFs such as MSFF 600 may be dynamically reconfigured into a buffer during a recovery power gating operational mode or during a functional/scan test operational mode, resulting in a reduction in the number of required scan chains and accordingly in test times.

Figure 7:
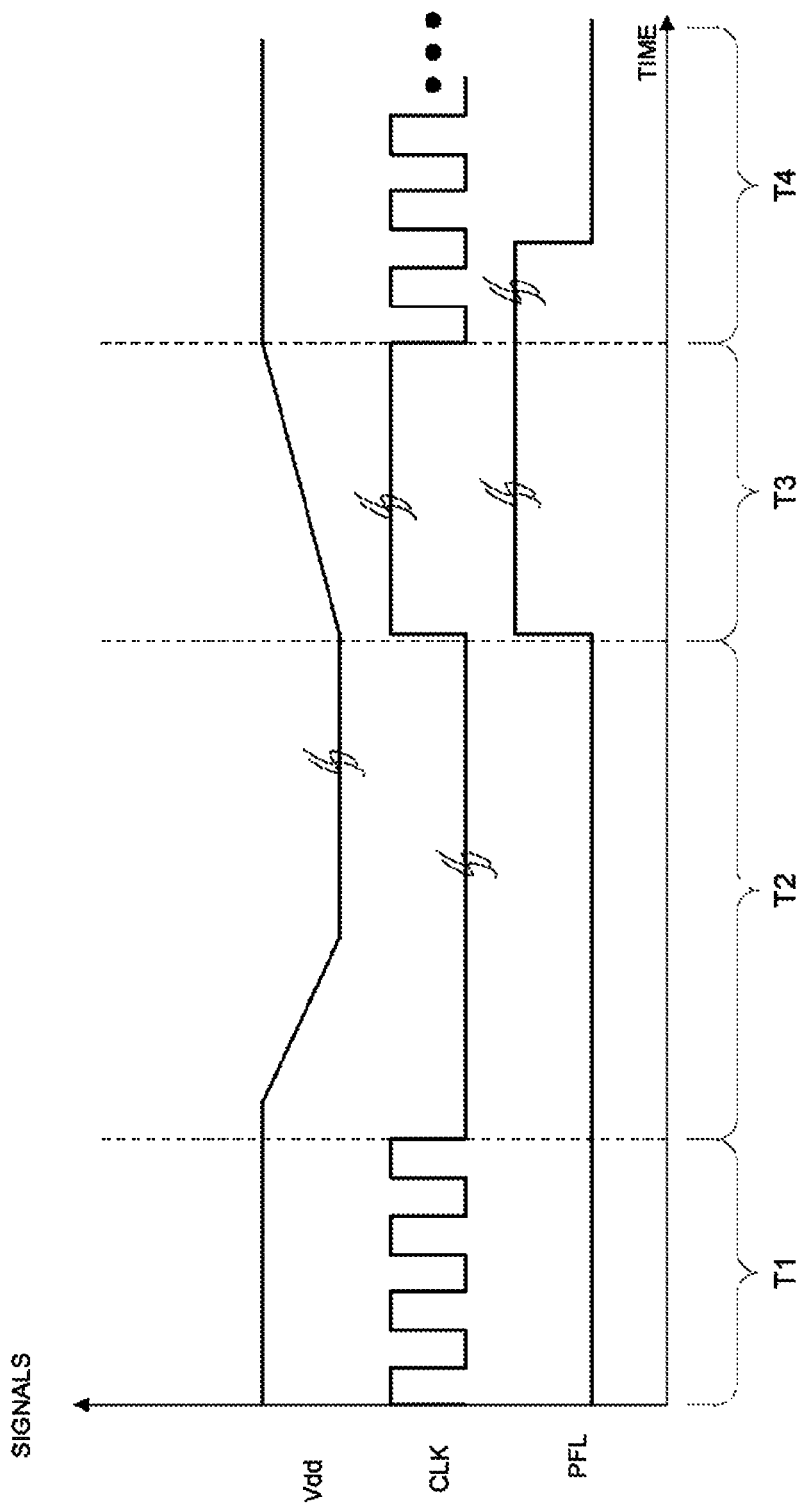
FIG. 7 illustrates a timing diagram representation of one or more signals associated with the storage element of FIG. 6.

FIG. 7 illustrates a timing diagram representation of one or more signals associated with the storage element of FIG. 6. In a first power gating operational mode, represented within the context of FIG. 7 as time period T1, during which a rail voltage (Vdd) as well as a secondary, lower rail voltage Vddc and a clock signal (CLK) are applied to each of state-retention storage elements and storage elements as previously-described, a PFL control signal is held at a logical "low" level as shown. In a second power gating operational mode, represented within the context of FIG. 7 as time period T2, the Vdd rail voltage is withdrawn from the associated electronic circuit and clock signal CLK may be low or undetermined. In a third power gating operational mode, represented within the context of FIG. 7 as time period T3, MSFF 600 is flushed by raising the PFL control signal to a logical "high" value such that both clock signal CLK and a buffered clock signal CLKb applied to NMOS 602 are similarly held to a logical "high" level such that any applied input data signal is passed through NMOS transistors 602 and 608 and inverters 604 and 614 to the output of MSFF 600. In a fourth power gating operational mode, represented within the context of FIG. 7 as time period T4, MSFF 600 resumes normal operation/processing and, after a sufficient time period elapsed to ensure MSFF 600 has been flushed, the PFL control signal is brought to a logical "low" level.

Figure 8:
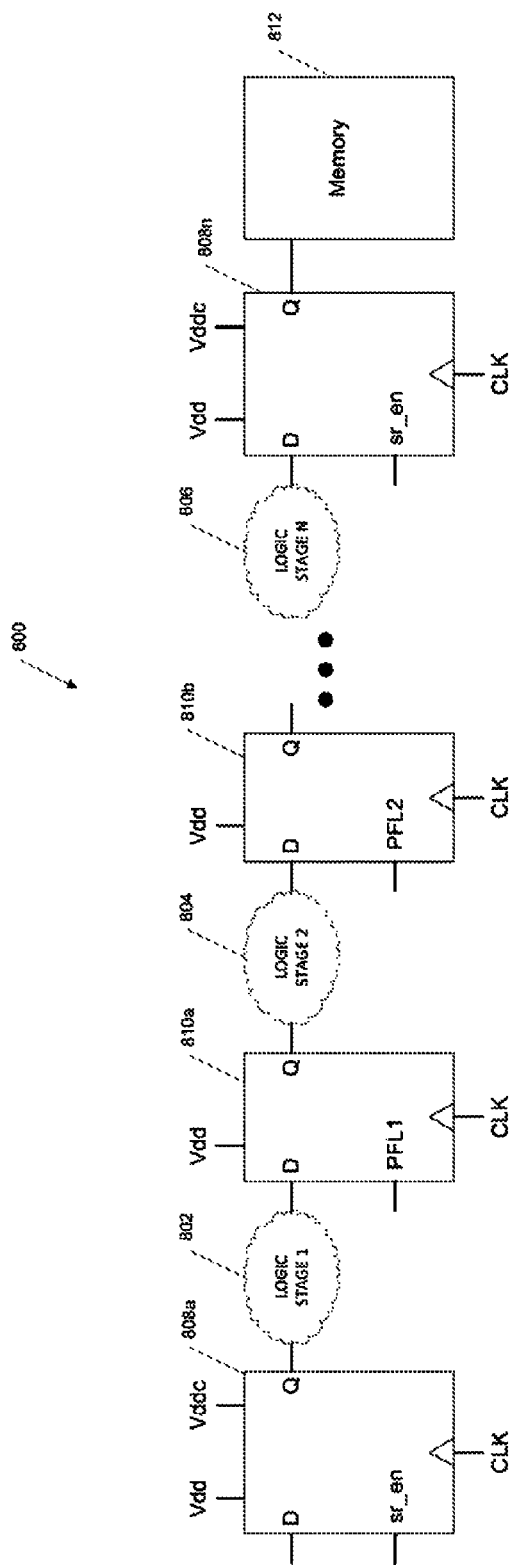
FIG. 8 illustrates an electronic circuit according to a second embodiment of the inventive subject matter.

FIG. 8 illustrates an electronic circuit according to a second embodiment of the inventive subject matter. More specifically, electronic circuit 800 provides sequential logic stage or pipeline flush control via a plurality of separate PFL control signals as will be described in greater detail herein. Similarly to that previously described with respect to FIG. 2, electronic circuit 800 of the depicted embodiment includes state-retention storage elements 808 coupled to a logic array which includes a number of logic stages 802 and a number of additional storage elements 810, which, in the illustrated embodiment is further coupled to a memory 812, as shown. In operation, electronic circuit 800 may operate in any of a plurality of power gating modes as described herein. Unlike the electronic circuit depicted and described with regard to FIG. 2 however, each of additional storage elements 810 has an independently controllable/assertable PFL control signal allowing such storage elements to be sequentially or otherwise independently flushed. According to one embodiment, sequential rather than simultaneous flushing/bypass/flow-through reduces peak inrush current, I*R drop, and di/dt noise during a recovery power gating operational mode. According to one embodiment of the inventive subject matter, such a sequential flush recovery method is utilized between state-retention storage element-bounded stages. In yet another embodiment, a time period during which each storage element is bypassed/flushed is programmable.

Figure 9:
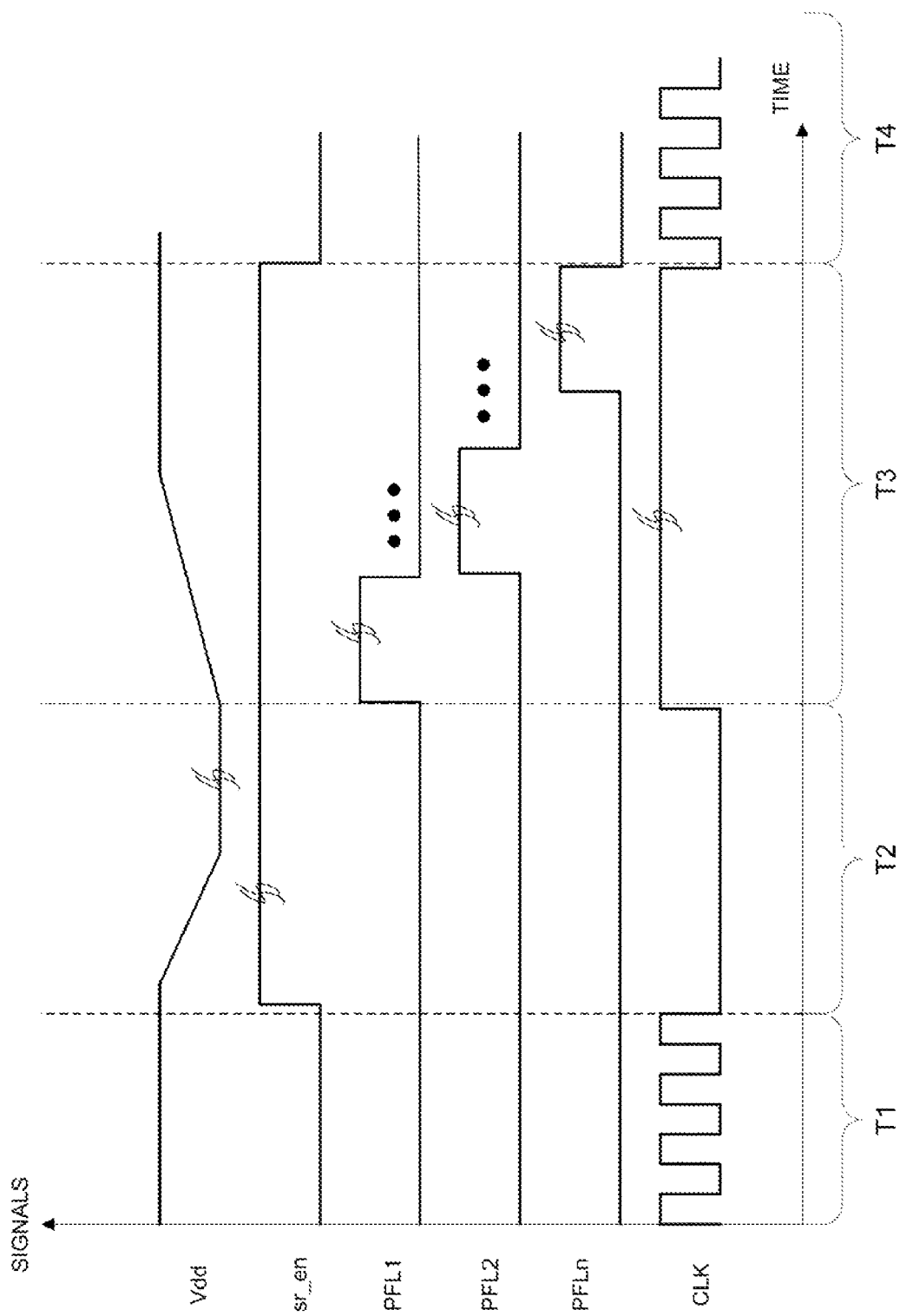
FIG. 9 illustrates a timing diagram representation of one or more signals associated with the electronic circuit of FIG. 8.

FIG. 9 illustrates a timing diagram representation of one or more signals associated with the electronic circuit of FIG. 8. In a first power gating operational mode, represented within the context of FIG. 9 as time period T1, during which a rail voltage (Vdd) as well as a secondary, lower rail voltage Vddc (not shown) and a clock signal (CLK) are applied to each of state-retention storage elements and storage elements as previously-described, a plurality of PFL control signals are held at a logical "low" level as shown. In a second power gating operational mode, represented within the context of FIG. 9 as time period T2, the Vdd rail voltage is withdrawn from the associated electronic circuit, clock signal CLK may be low or undetermined, and an sr_en control signal is held at a logical "high" level to effect the storage of state within associated state-retention storage elements. During the described second power gating operational mode, PFL control signals remain at a logical "low" level as shown. In a third power gating operational mode, represented within the context of FIG. 9 as time period T3, additional storage elements are sequentially flushed by raising associated PFL control signals and clock signal CLK to a logical "high" value. In a fourth power gating operational mode, represented within the context of FIG. 9 as time period T4, electronic circuit 800 resumes normal operation/processing in a "function" operational mode in which clock signal CLK is also activated. After a sufficient time period elapsed to ensure all additional storage elements have been flushed, the sr_en control signal is brought to a logical "low" level.

Figure 10:
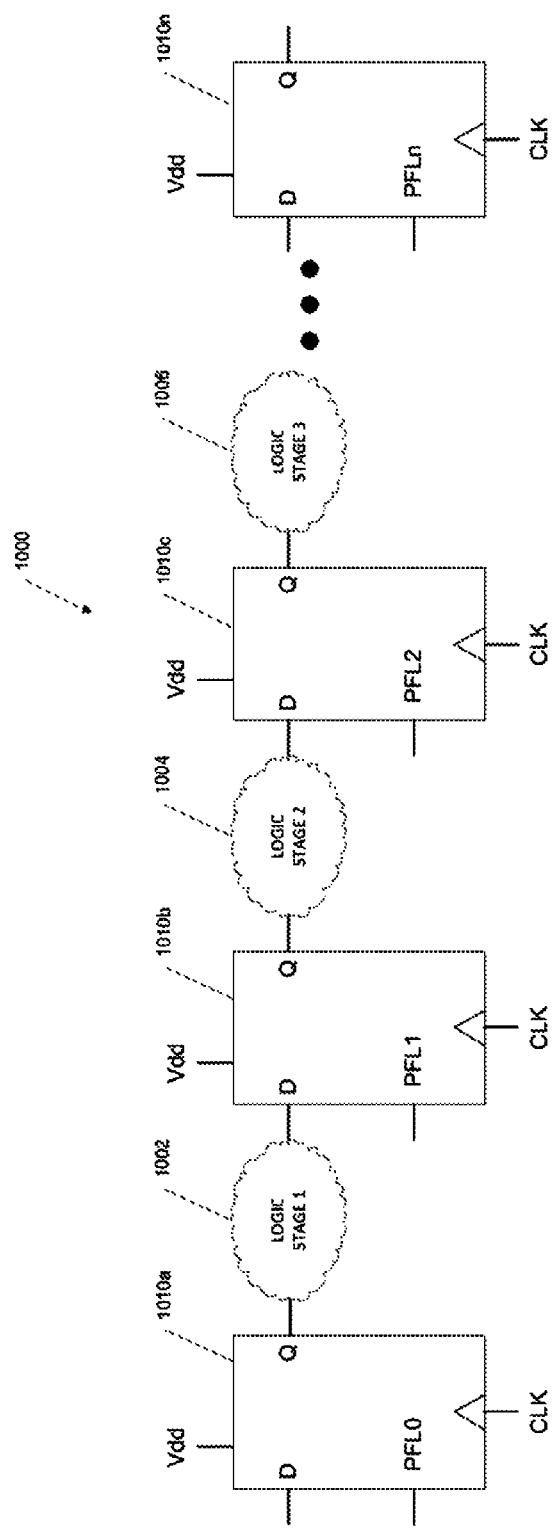
FIG. 10 illustrates an electronic circuit according to a third embodiment of the inventive subject matter.

FIG. 10 illustrates an electronic circuit according to a third embodiment of the inventive subject matter. More specifically, electronic circuit 1000 provides pipeline or logic stage merge functionality utilizing one or more storage elements such as have been described herein with respect to, for example, FIGS. 5 and 7. By merging logic or pipeline stages a built in self test (BIST) testing mode is provided. Each storage element 1010 of the depicted electronic circuit includes a separate PFL control signal input as will be described in greater detail herein. Storage elements 1010 are interspersed between logic stages 1002-1006 as shown. According to one embodiment, logic stage 1002 includes address pre-decode error correcting code (ECC) coding, logic stage 1004 includes static random access memory (SRAM) access functionality, and logic stage 1006 provides ECC functionality. Utilizing an electronic circuit such as that depicted in FIG. 10, (pipeline) logic stages can be selectively merged to enable new testing modes. According to one embodiment, such testing modes include a memory BIST mode with optional ECC to leverage ECC error correction for yield loss recover on soft-error failures.

Figure 11:
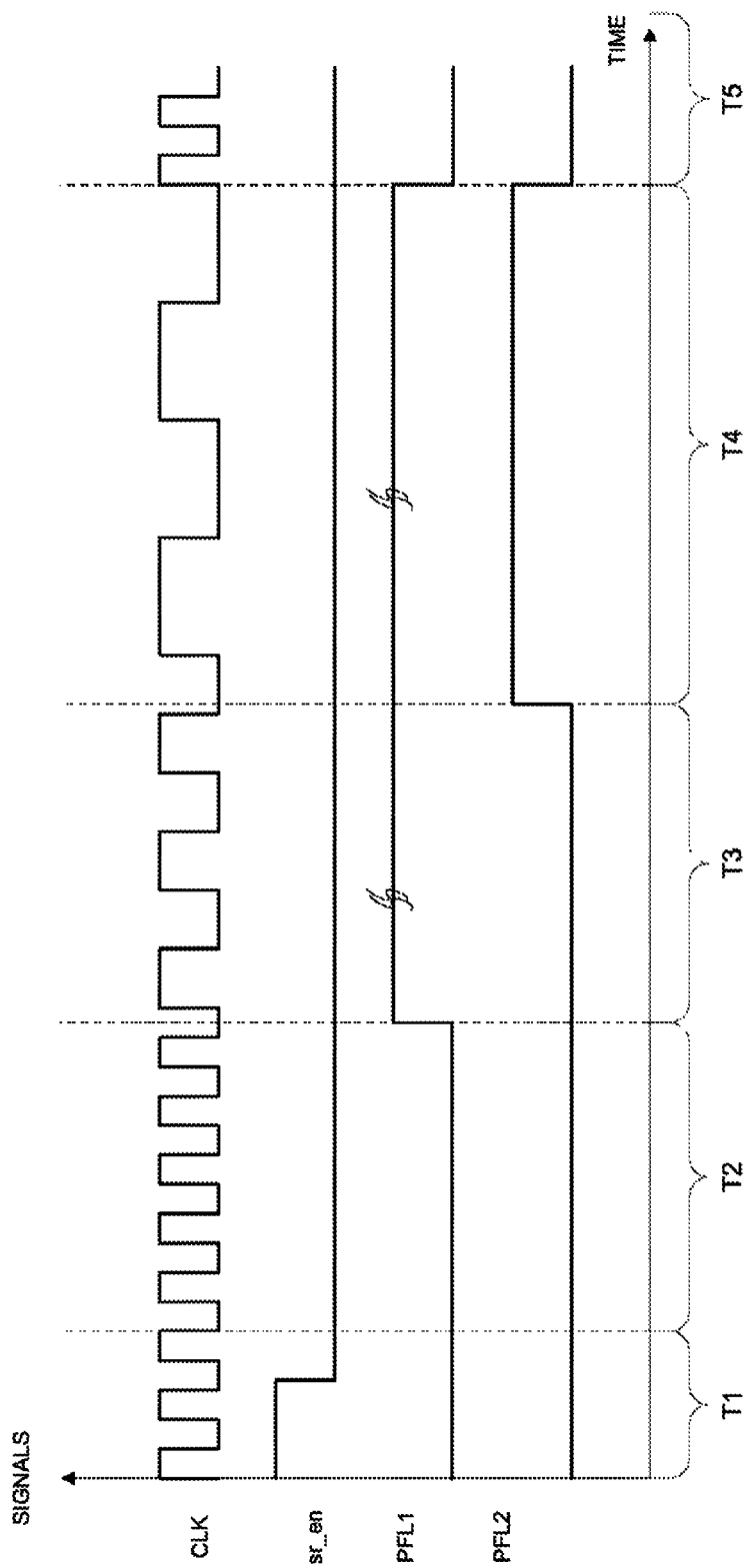
FIG. 11 illustrates a timing diagram representation of one or more signals associated a test mode of the electronic circuit of FIG. 10.

FIG. 11 illustrates a timing diagram representation of one or more signals associated a first test mode of the electronic circuit of FIG. 10. In a first time period T1, a clock signal CLK having a first frequency is applied to all storage elements 1010 of electronic circuit 1000, PFL control signals PFL1 and PFL2 are held at a logical "low" level. During a second time period T2, a conventional BIST testing mode is entered and a set of input test vectors generated by the BIST testing mode (BIST engine) is applied to an input of a circuit under test, i.e., electronic circuit 1000. A set of stored state information from an associated state-retention storage element placed "upstream" from electronic circuit 1000 of FIG. 10 may also be applied to an input of the electronic circuit under test according to one embodiment. At a third time period T3, a PFL1 control signal is set to a logical "high" value, effectively merging logic stage 1002 and logic stage 1004 into a single logic or pipeline stage for test and a frequency of the applied clock signal CLK is decreased to allow input propagation and processing via the merged logic stage. Similarly at the beginning of a fourth time period T4, a PFL2 control signal is set to a logical "high" value merging logic stage 1006 with the previously-merged logic stage generated during time period T3. Again the frequency of the applied clock signal CLK is reduced to enable propagation and processing of applied data inputs to the generated merged logic stage comprising logic stages 1002-1006. At the beginning of a fifth time period T5, the input clock signal CLK is returned to its original frequency and a function operation mode is resumed. In each instance where an applied clock signal frequency is adjusted, the applied clock signal cycle time is defined as being greater than or equal to the sum of logic propagation delay, setup time of data to clock/retain at an associated storage element, and clock to data launch time of the associated storage element.

Figure 12:
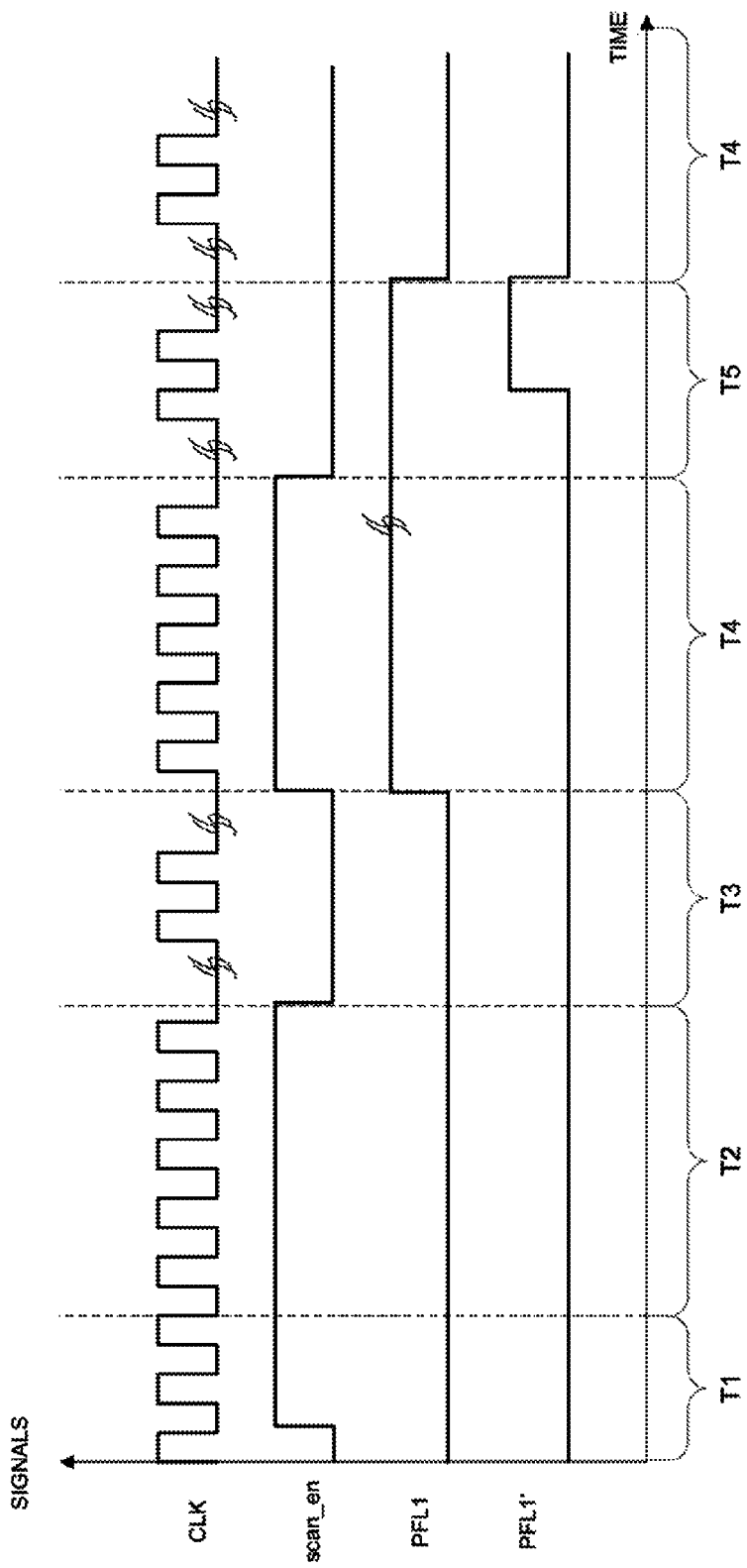
FIG. 12 illustrates a timing diagram representation of one or more signals associated another test mode of the electronic circuit of FIG. 10.

FIG. 12 illustrates a timing diagram representation of one or more signals associated with a second test mode of the electronic circuit of FIG. 10. More specifically, a setup and delay testing mode is provided in the depicted embodiment whereby by selectively merging logic stages and therefore bypassing associated storage elements, timing characteristics such as launch and hold time of bypassed storage elements may be determined. In the illustrated embodiment of FIG. 12, a scan_en control signal is asserted and deasserted to launch and capture scan chain data inputs to portions of electronic circuit 1000.

In a first time period T1 and a second time period T2, the described scan_en control signal is held to a logical "high" level to load scan chain values into storage elements 1010 of electronic circuit 1000. According to one embodiment, such scan chain values may be loaded via a mux/multiplexer-D type scan input port of storage elements 1010 (not shown in FIG. 10). At the beginning of a time period T3, the scan_en control signal is brought to a logical "low" value to launch the scan chain and capture results using a conventional scan testing technique. Thereafter, a timing edge of a PFL1 control signal may be varied (as represented by PFL1') to bypass an associated storage element 1010*b* and to merge adjacent logic stages 1002 and 1004. Whether storage element 1010*b* captures inputs provided by a prior logic stage 1002 will depend on the delay characteristics (e.g., setup and hold time) of the storage element and when PFL1 is clocked. Consequently, setup and delay timing margins for each of storage elements 1010 may be determined using the indicated technique.

Figure 13:
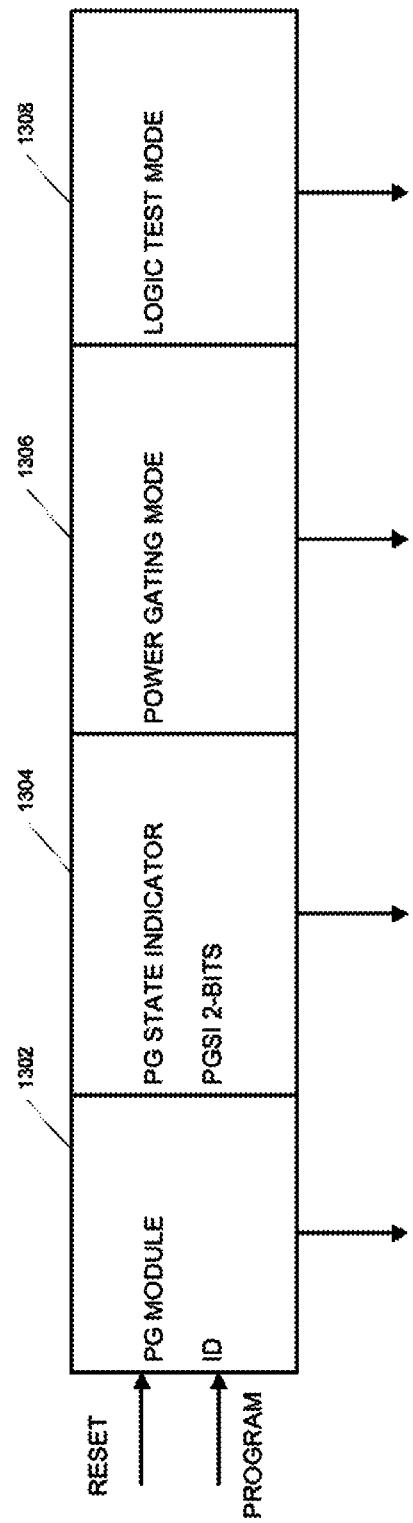
FIG. 13 illustrates an electronic circuit reconfiguration register according to one or more embodiments of the inventive subject matter.

FIG. 13 illustrates an electronic circuit reconfiguration register according to one or more embodiments of the inventive subject matter. The indicated reconfiguration register of FIG. 13 includes a reset input and a program input for populating one or more fields or storage elements 1302-1308 of the reconfiguration register as shown. More specifically, the reconfiguration register of FIG. 13 includes a power gating module identifier 1302, a power gating state identifier 1304, a power gating mode bit 1306 and a logic test mode bit 1308. Utilizing the indicated fields or storage elements, an array of logic stages or pipeline may be reconfigured or analyzed in keeping with the embodiments described herein.

Figure 14:
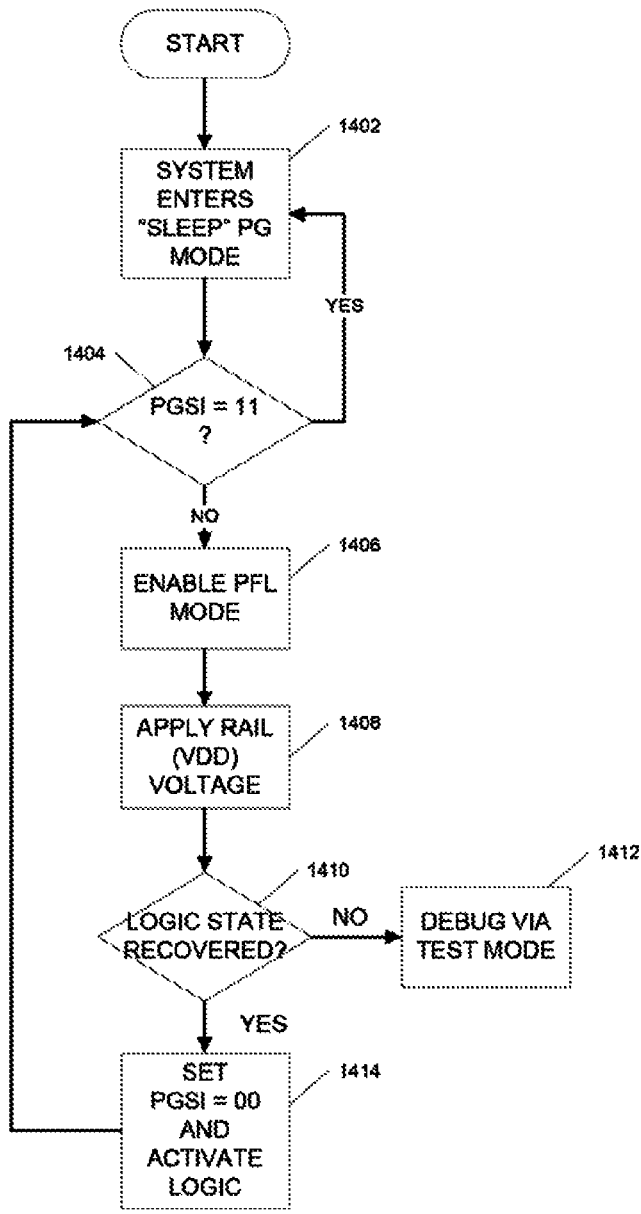
FIG. 14 illustrates a high-level process flow diagram representing an electronic circuit reconfiguration process according to one or more embodiments of the inventive subject matter.

FIG. 14 illustrates a high-level process flow diagram representing an electronic circuit reconfiguration process according to one or more embodiments of the inventive subject matter. In the illustrated process embodiment, a system (e.g., an electronic circuit) initially enters a "sleep" power gating mode (process block 1402) wherein a power supply voltage is gated off from a supply voltage input of the electronic circuit. Thereafter a determination is made whether a power gating state indicator holds a "11" value indicating that a sleep power gating mode is the next power gating mode to be entered by the system. If so, the depicted process returns to process block 1402 as shown. Otherwise a PFL mode is enabled (process block 1406) where select storage elements are reconfigured to act as buffers or otherwise to bypass or "flow-through" received inputs. A power supply voltage (Vdd) is then ramped up at an associated input to the electronic circuit (process block 1408). Thereafter, a determination is made whether a previously-stored logic state has been recovered (process block 1410). If so, the power gating state indicator is set to hold a "00" value indicating that an active or functional operational mode is entered by the system and associated logic is activated (process block 1414) before the indicated process returns (process block 1404) as shown. In response to a determination that a previously-stored logic state has not been recovered, a test mode is entered whereby the system's recovery operation may be debugged (process block 1412).

According to one embodiment, a "sleep" power gating mode (process block 1402) is associated with a power gating operational mode such as that represented within the context of FIG. 3 as time period T2. Similarly, in the described embodiment, PFL mode (process block 1406) corresponds to a power gating operational mode such as that represented within the context of FIG. 3 as time period T3 and active or functional operational mode (process block 1414) corresponds to power gating operational modes represented by both time period T1 and T4 of FIG. 3. It will be appreciated that variations made be made in the operational of a method or process as depicted in FIG. 14. For example, an active or functional state in which logic is activated (process block 1414) may be retained for an extended period of time without entering directly into a sleep or PFL mode as shown.

Although the invention is described herein with reference to specific embodiments, various modifications and changes can be made without departing from the scope of the present invention as set forth in the claims below. For example, while the embodiments described herein reference specific flip-flop storage elements, alternative embodiments may be implemented using other storage element designs. Similarly, while selected embodiments have been illustrated using a separate PFL control signal, any of the described or illustrated embodiments may be implemented using different control signals such as the LSSD implementation illustrated in FIG. 4. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   receiving a control signal associated with a power gating operation mode of an electronic circuit; and
   maintaining data representing a state of a logic stage of said electronic circuit based upon said power gating operation mode, wherein said maintaining comprises:
   storing data of a state of a first logic stage of said electronic circuit within a first storage element in a first power gating operation mode;
   recovering data of a state of a second logic stage of said electronic circuit utilizing said data of said state of said first logic stage of said electronic circuit within said first storage element in a second power gating operation mode; and
   recovering data of a state of a third logic stage of said electronic circuit utilizing said data of said state of said second logic stage within a second storage element in said second power gating operation mode, said recovering data of said state of said second logic stage and recovering said data of said state of said third logic stage are performed sequentially.

2. The method of claim 1, wherein:
said recovering data of said state of said second logic stage of said electronic circuit comprises storing said data of said state of said second logic stage within a second storage element;
said storing data of said state of said first logic stage of said electronic circuit within said first storage element comprises storing data of said state of said first logic stage of said electronic circuit within a state-retention storage element having a plurality of rail voltage inputs; and
said storing said data of said state of said second logic stage within a second storage element comprises storing said data of said state of said second logic stage within a flow-through storage element having a single rail voltage input and a flow-through control signal input, which causes said flow-through storage element to switch between level-sensitive and edge-sensitive operation.

3. The method of claim 2, wherein:
said flow-through storage element comprises a level-sensitive scan design (LSSD) flip flop storage element;
said flow-through control signal input comprises a first clock signal input and a second clock signal input; and
said recovering data of said state of said second logic stage of said electronic circuit comprises providing a first clock signal at said first clock signal input and a second clock signal at said second clock signal input, each at a predetermined logical level associated with said second power gating operation mode.

4. The method of claim 2, wherein:
said flow-through storage element comprises a multiplexer to select between a data input and a scan input;
said flow-through control signal input comprises a multiplexer control signal input of said multiplexer; and
said recovering data of said state of said second logic stage of said electronic circuit comprises providing a multiplexer control signal at said multiplexer control signal input at a predetermined logical level associated with said second power gating operation mode.

5. The method of claim 1, wherein:
said recovering data of said state of said third logic stage of said electronic circuit comprises storing said data of said state of said third logic stage within a third storage element;
said second storage element comprises a first flow-through storage element and said third storage element comprises a second flow-through storage element; and
said maintaining data representing said state of said logic stage of said electronic circuit based upon said power gating operation mode comprises:
sequentially providing a first flow-through control signal at a predetermined logic level to a first flow-through control signal input of said first flow through storage element and then a second flow-through control signal at said predetermined logic level to a second flow-through control signal input of said second flow-through storage element.

6. The method of claim 5, wherein:
said sequentially providing comprises pulsing said first flow-through control signal and said second flow-through control signal at said predetermined logic level.

7. The method of claim 1, further comprising:
entering a built in self test (BIST) operation mode of said electronic circuit; and
merging said second logic stage and said third logic stage into a unified logic stage in response to entry into said BIST operation mode.

8. The method of claim 7, further comprising:
providing a clock signal to each of said second logic stage and said third logic stage, wherein
said merging said second logic stage and said third logic stage into said unified logic stage comprises varying a frequency of said clock signal.

9. The method of claim 7, wherein:
said merging said second logic stage and said third logic stage into said unified logic stage comprises,
configuring said second storage element as a flow-through buffer in a first BIST operation mode; and
configuring said second storage element as a clocked flip-flop in a second BIST operation mode.

10. The method of claim 7, said method further comprising:
determining a timing characteristic of said second storage element in response to said merging.

11. An electronic circuit comprising:
a plurality of logic stages comprising a first logic stage and a second logic stage;
a first storage element coupled to said first logic stage to store data of a state of said first logic stage in a first power gating operation mode;
a second storage element coupled to said second logic stage and to said first logic stage to recover data of a state of said second logic stage utilizing data of said state of said first logic stage received via said first storage element in a second power gating operation mode;
a third storage element coupled to said second logic stage; and
an input to receive a control signal specifying at least one of said first power gating operation mode and said second power gating operation mode;
wherein:
each of said second storage element and said third storage element comprise an input to sequentially receive a corresponding one of a plurality of flow-through control signals at a predetermined logic level; and
upon receipt of a corresponding one of said plurality of flow-through control signals at said predetermined logic level, each of said second storage element and said third storage element enters a level-sensitive mode of operation.

12. The electronic circuit of claim 11, wherein:
said first storage element comprises a state-retention storage element having a plurality of rail voltage inputs; and
said second storage element comprises a flow-through storage element having a single rail voltage input and a flow-through control signal input, which causes said flow-through storage element to switch between level-sensitive and edge-sensitive operation.

13. The electronic circuit of claim 12, wherein:
said flow-through storage element comprises a level-sensitive scan design (LSSD) flip flop storage element; and
said LSSD flip flop storage element comprises a first input to receive a first clock signal and a second input to receive a second clock signal.

14. The electronic circuit of claim 12, wherein:
said flow-through storage element comprises a multiplexer to select between a data input and a scan input.

15. The electronic circuit of claim 11, wherein said electronic circuit comprises a microcontroller.

16. The electronic circuit of claim 11, wherein said electronic circuit comprises a microprocessor.

17. The electronic circuit of claim 11, wherein:
said electronic circuit further comprises an electronic circuit reconfiguration register; and
said electronic circuit reconfiguration register comprises a plurality of bits to store data specifying at least one of said first power gating operation mode and said second power gating operation mode.

18. A system comprising:
a sensor;
a microcontroller coupled to said sensor, said microcontroller comprising the electronic circuit of claim 11.

19. A method comprising:
receiving a control signal associated with a power gating operation mode of an electronic circuit, said control signal having a first state indicating a low-power operation mode wherein a first power rail is deactivated and a second power rail remains activated, and a second state indicating a normal operation mode wherein the first power rail is activated;
storing data representing a state of a first logic stage at a first storage element, said first storage element receiving power from said first and from said second power rail and configured to retain data stored therein in said low-power operation mode;
storing data representing a state of a second logic stage at a second storage element, said second logic stage coupled to an output of said first storage element, wherein said second storage element receives power only from said second power rail and data stored at said second storage element is lost in said low-power operation mode; and
upon transitioning from said low-power operation mode to said normal operation mode, recovering said data representing said state of said second logic stage at said second storage element utilizing said data stored at said first storage element by activating a flow-through control signal at an input of said second storage element, said control signal causing said second storage element to transition from edge-sensitive operation to level-sensitive operation and enabling data representing said state of said second logic stage to be stored at said second storage element.

* * * * *